United States Patent
Hiner et al.

(10) Patent No.: US 6,683,763 B1
(45) Date of Patent: Jan. 27, 2004

(54) METHOD AND SYSTEM FOR PROVIDING A SELF-ALIGNED ELECTRICAL CONTACT FOR A TMR ELEMENT

(75) Inventors: Hugh C. Hiner, Fremont, CA (US);
Kyusik Sin, Pleasanton, CA (US);
William Jensen, Fremont, CA (US);
Xizeng Shi, Fremont, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 09/990,738

(22) Filed: Nov. 21, 2001

Related U.S. Application Data
(60) Provisional application No. 60/312,357, filed on Aug. 15, 2001.

(51) Int. Cl.⁷ ............................. G11B 5/127; G11B 5/39
(52) U.S. Cl. ..................................... 360/324.2
(58) Field of Search .................. 360/324.2, 324.1, 360/324, 313, 110

(56) References Cited

U.S. PATENT DOCUMENTS 6,330,136 B1 * 12/2001 Wang et al. ............. 360/324.2
6,353,318 B1 * 3/2002 Sin et al. .................... 324/252

* cited by examiner

*Primary Examiner*—William Klimowicz
*Assistant Examiner*—Julie Anne Watko
(74) *Attorney, Agent, or Firm*—Sawyer Law Group LLP

(57) ABSTRACT

A method and structure for providing a tunneling magnetoresistive (TMR) element is disclosed. The method and structure include providing a TMR layer that includes a first magnetic layer, a second magnetic layer and a first insulating layer disposed between the first magnetic layer and the second magnetic layer. The method and structure also include providing a first material and a protective layer. The first material allows electrical contact to be made to the tunneling magnetoresistive layer and is disposed above the tunneling magnetoresistive layer. The first material is capable of being undercut by an plasma etch without exposing a portion of the tunneling magnetoresistive layer under a remaining portion of the first material. The second protective layer covers a portion of the tunneling magnetoresistive sensor and a portion of the first material. In one aspect, the method and structure also include providing a second material disposed between the tunneling magnetoresistive layer and the first material. The second material allows electrical contact to be made to the tunneling magnetoresistive layer and is resistant to removal by the plasma etch.

6 Claims, 7 Drawing Sheets

METHOD AND SYSTEM FOR PROVIDING A SELF-ALIGNED ELECTRICAL CONTACT FOR A TMR ELEMENT

CROSS-REFERENCE TO RELATED APPLICATION(S)

This application is claiming under 35 USC 119(e) the benefit of provisional patent Application serial No. 60/312,357 filed on Aug. 15, 2001.

FIELD OF THE INVENTION

The present invention relates to magnetic systems, and more particularly to an improved method and structure for providing electrical contact to a TMR element.

BACKGROUND OF THE INVENTION

Tunneling magnetoresistive (TMR) elements are of increasing interest for a variety of applications. FIG. 1 depicts a conventional method 10 for providing a conventional TMR element. FIGS. 2A through 2D depict the conventional TMR element 30 during formation. Referring to FIGS. 1 and 2A–2D, the layers for the conventional TMR element 30 are formed, via step 12. Step 12 includes forming ferromagnetic layers separated by a nonmagnetic insulating layer. One of the ferromagnetic layers is a pinned layer, having its magnetization pinned in placed, typically using an antiferromagnetic layer. The other ferromagnetic layer is a free layer, having its magnetization free to move in response to an external field. A capping layer, for example Ta is also typically provided. A PMGI layer is formed on the TMR layer, via step 14. A layer of photoresist is formed on the PMGI layer and patterned, via step 16. Typically, the resist is patterned by photolithography. The PMGI is then undercut, via step 18. Step 18 is performed by selectively dissolving a portion of the PMGI under the resist. FIG. 2A depicts the conventional TMR element 30 after step 18 has been performed. Ferromagnetic layers 32 and 36 of the TMR element 30 are separated by a thin insulating layer 34. An antiferromagnetic layer 31 is also depicted. Thus, the conventional TMR element 30 is a conventional bottom pinned TMR element. A capping layer 37 is also typically present. The insulating layer 34 is thin enough to allow charge carriers to tunnel through the insulating layer 34. Based upon the difference between the magnetizations of the ferromagnetic layers 32 and 36 the resistance of the conventional TMR element 30 changes. Also shown are the photoresist 40 and the PMGI 38. The PMGI 38 has been undercut below the edge of the photoresist 40. Thus, bi-layer structure is formed by the PMGI 38 and the photoresist 40.

The conventional TMR element 30 is then defined, via step 20. Typically, step 20 is accomplished using a reactive ion etch or by ion milling. FIG. 2B depicts the conventional TMR element 30 after step 20 has been performed. Because of the bi-layer structure formed by the undercut PMGI 38 and the resist 40, the conventional TMR element 30 has the desired shape and size. A dielectric film is then deposited to partially encapsulate the conventional TMR element 30, via step 22. FIG. 2C depicts the conventional TMR element 30 after step 22 has been preformed. The dielectric film having portions 42A, 42B and 42C has been deposited. Because of the presence of the PMGI 38 and the photoresist 40, the dielectric film 42A and 42B covers only the side portions of the conventional TMR element 10. Also shown is dielectric film 42C that covers the photoresist 40. The photoresist 40, PMGI 38 and dielectric film 42C are then removed, via step 24. FIG. 2D depicts the conventional TMR element 30 after removal of the PMGI 38 and the photoresist 40. Because the top of the conventional TMR element 30 is now exposed, electrical contact can then be made to the conventional TMR element 30.

Although the conventional method 10 functions, one of ordinary skill in the art will readily recognize that the method 10 may not adequately function for smaller sizes of the conventional TMR element 30. As the size of the conventional TMR element 30 decreases, for example below 0.5 microns, undercutting the PMGI 38 in step 18 becomes problematic. In particular, the PMGI 38 may wash away entirely instead of being selectively dissolved. Because the PMGI 38 is completely removed instead of being undercut, the conventional TMR element 30 cannot be defined.

Accordingly, what is needed is a structure and method for providing a smaller TMR element as well as for providing electrical contact to such a smaller TMR element. The present invention addresses such a need.

SUMMARY OF THE INVENTION

The present invention provides a method and structure for providing a tunneling magnetoresistive (TMR) element. The method and structure comprise providing a TMR layer that includes a first magnetic layer, a second magnetic layer and a first insulating layer disposed between the first magnetic layer and the second magnetic layer. The method and structure also comprise providing a first material and a protective layer. The first material allows electrical contact to be made to the tunneling magnetoresistive layer and is disposed above the tunneling magnetoresistive layer. The first material is capable of being undercut by a plasma etch without exposing a portion of the tunneling magnetoresistive layer under the remaining portion of the first material. The second protective layer covers a portion of the tunneling magnetoresistive sensor and a portion of the first material. In one aspect, the method and structure also include providing a second material disposed between the tunneling magnetoresistive layer and the first material. The second material allows electrical contact to be made to the tunneling magnetoresistive layer through the first material and the second material. The second material is both resistant to removal by the plasma etch and provides protection for the TMR element.

According to the structure and method disclosed herein, the present invention provides a TMR element that can be made smaller and to which electrical contact can be made.

DETAILED DESCRIPTION OF THE INVENTION

The present invention relates to an improvement in magnetic material processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides method and structure for providing a tunneling magnetoresistive (TMR) element. The method and structure comprise providing a TMR layer that includes a first magnetic layer, a second magnetic layer and a first insulating layer disposed between the first magnetic layer and the second magnetic layer. The method and structure also comprise providing a first material and an insulating layer. The first material allows electrical contact to be made to the tunneling magnetoresistive layer and is disposed above the tunneling magnetoresistive layer. The first material is capable of being undercut by a plasma etch without exposing a portion of the tunneling magnetoresistive layer under the remaining portion of the first material. The second insulating layer covers a portion of the tunneling magnetoresistive sensor and a portion of the first material. In one aspect, the method and structure also include providing a second material disposed between the tunneling magnetoresistive layer and the first material. The second material allows electrical contact to be made to the tunneling magnetoresistive layer through the first material and the second material. The second material is also resistant to removal by the plasma etch.

The present invention will be described in terms of a particular TMR element formed using certain materials. However, one of ordinary skill in the art will readily recognize that this method and structure will operate effectively for other TMR elements and other materials having the desired properties. Moreover, the present invention will be described in the context of methods having particular steps. Furthermore, for clarity, certain steps are omitted. Consequently, one of ordinary skill in the art will readily recognize that the present invention is consistent with methods having other and/or additional steps. Furthermore, the present invention is described in the context of a TMR element having a bottom pinned layer. However, one of ordinary skill in the art will readily recognize that the present invention is consistent with a TMR element having a top pinned layer or a bottom pinned layer. Thus, the present invention can be used either with a bottom pinned TMR element or, alternatively, with a top pinned TMR element having a top antiferromagnetic layer.

Figure 1:
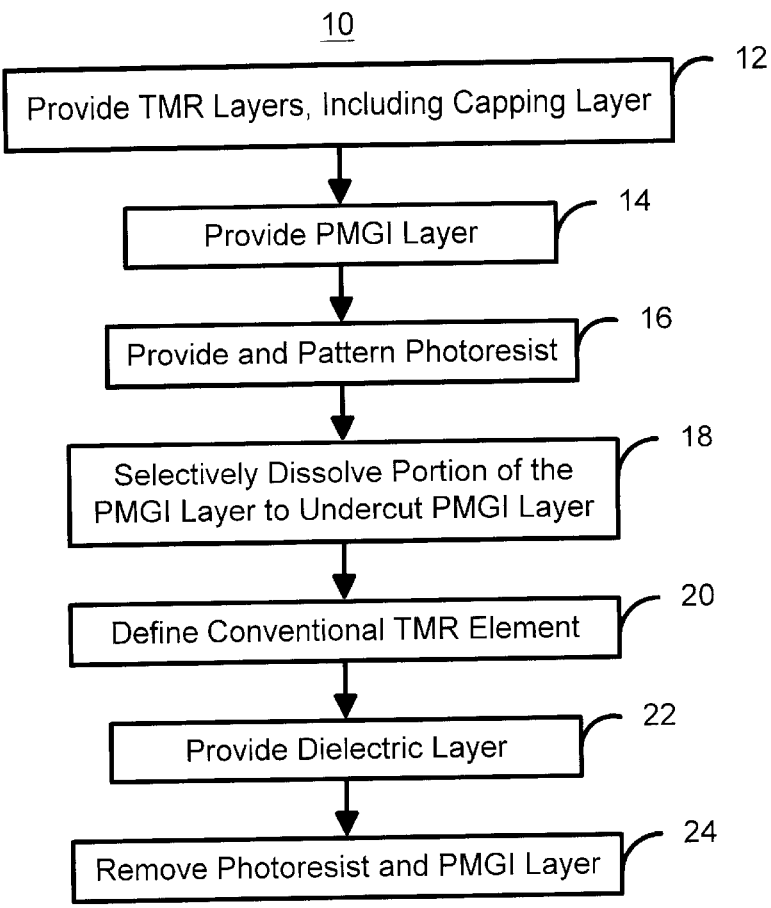
FIG. 1 is a flow chart depicting a conventional method for providing a conventional TMR element.
Figure 2A:
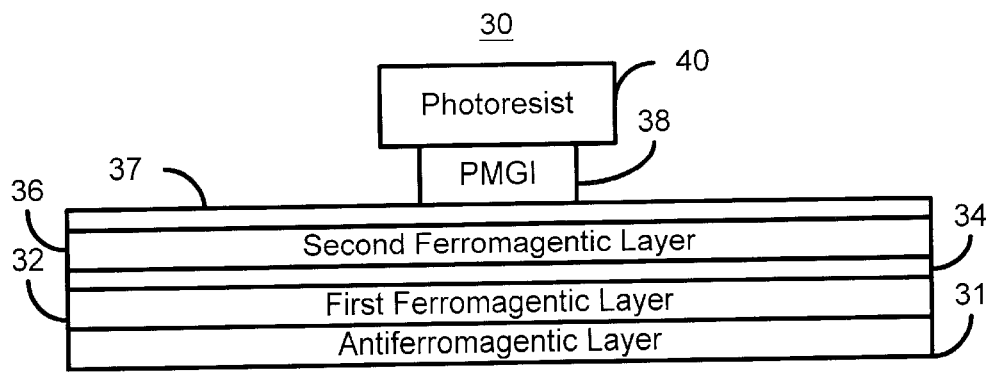
FIGS. 2A–2D are diagrams of the conventional TMR element during formation.
Figure 2B:
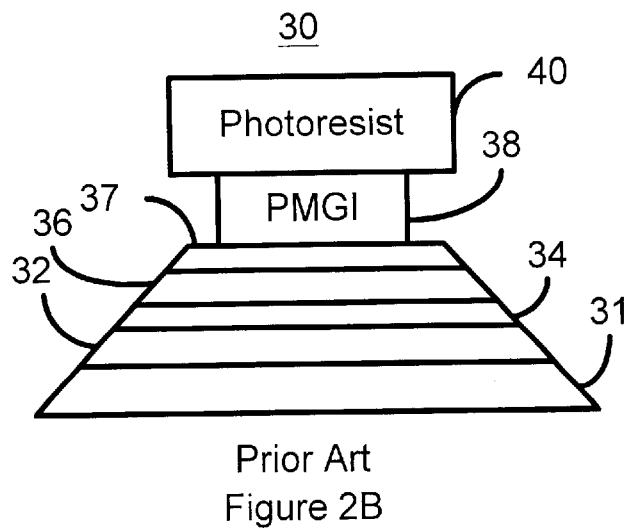
Figure 2C:
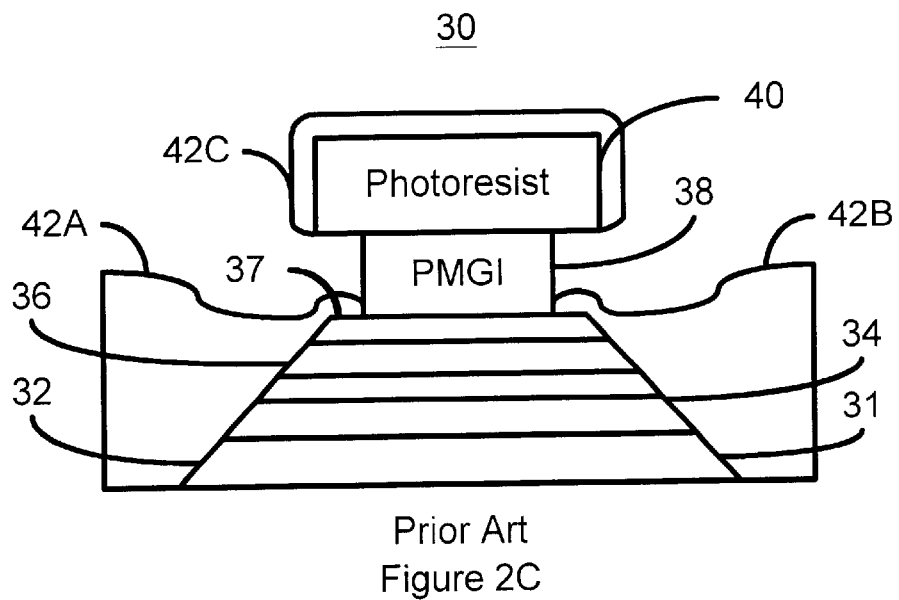
Figure 2D:
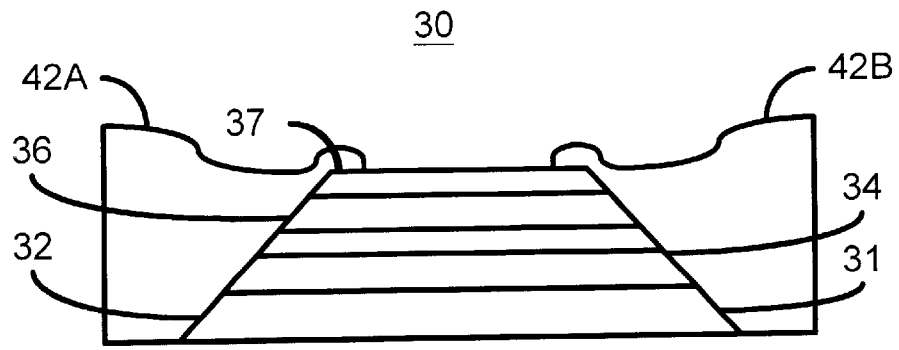
Figure 3:
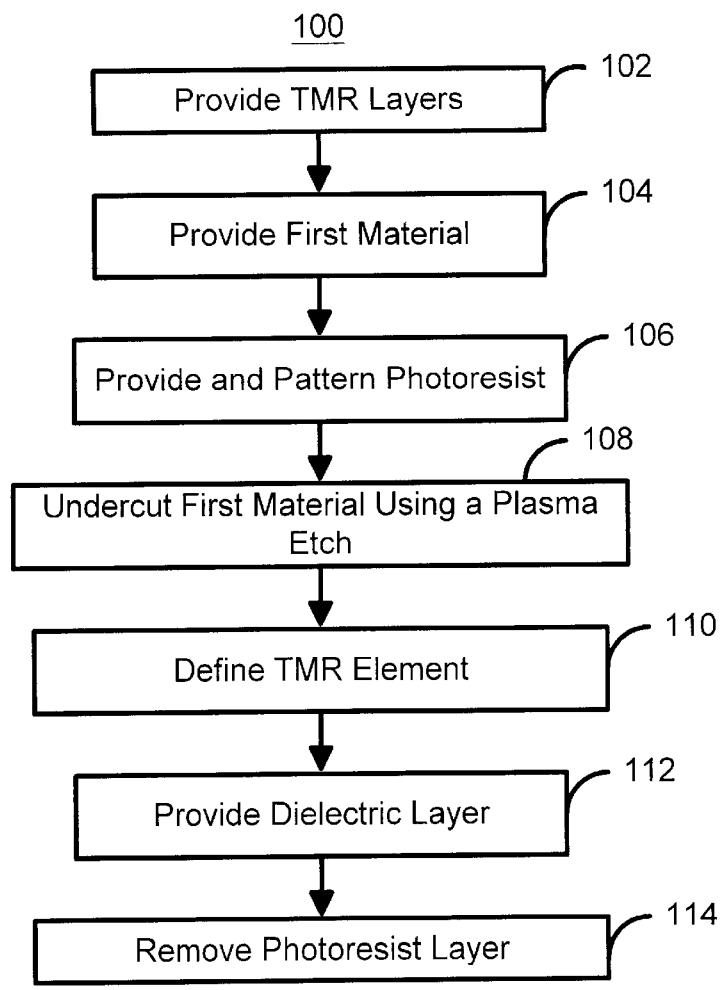
FIG. 3 is a flow chart depicting one embodiment of a method in accordance with the present invention for providing a TMR sensor in accordance with the present invention.
Figure 4A:
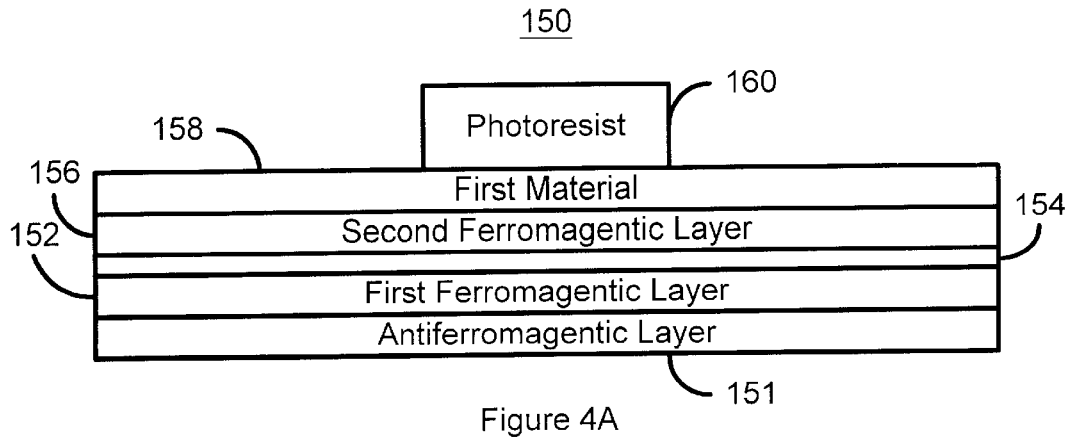
FIGS. 4A–4E are diagrams of one embodiment of a TMR element in accordance with the present invention during formation.

To more particularly illustrate the method and structure in accordance with the present invention, refer now to FIG. 3, depicting one embodiment of a method 100 in accordance with the present invention for providing a TMR sensor in accordance with the present invention. FIGS. 4A–4E are diagrams of one embodiment of a TMR element 150 in accordance with the present invention during formation. Referring to FIGS. 3 and 4A–4E, the layers for the TMR element are formed, via step 102. Step 102 includes forming two ferromagnetic layers separated by a nonmagnetic insulating layer. Step 102 also includes ensuring that one of the ferromagnetic layers is a pinned layer, while the other is a free layer. Thus, step 102 preferably also includes forming an antiferromagnetic layer adjacent to the pinned layer. For a top pinned layer TMR element, the antiferromagnetic layer is formed on the top ferromagnetic layer. For a bottom pinned layer TMR element, the first, bottom ferromagnetic layer is formed on the antiferromagnetic layer. A first material is then deposited, via step 104. Electrical contact can be made to the TMR element 150 through the first material. The first material is also capable of being undercut by a plasma etch without exposing a portion of the tunneling magnetoresistive layer under a remaining portion of the first material. In a preferred embodiment, this is achieved by ensuring that the layer below the first material is resistant to an etch which can remove the first material. Thus, the first material will take the place of the PMGI 38 in the bi-layer structure used in defining the TMR element 150. A layer of photoresist is provided and patterned, via step 106. Preferably, the photo resist is patterned via photolithography. FIG. 4A depicts one embodiment of the TMR element 150 in accordance with the present invention after step 106 has been performed. The layers that form the TMR element 150 include antiferromagnetic layer 151 and ferromagnetic layers 152 and 156 separated by a thin insulating layer 154. The antiferromagnetic layer 151 is used to pin the magnetization of the ferromagnetic layer 152. The insulating layer 154 is thin enough to allow charge carriers to tunnel between the ferromagnetic layers 152 and 156. Although the TMR element 150 shown is a bottom pinned layer, nothing prevents the TMR element from being a top pinned TMR element. Also depicted is the first material 158. The first material is preferably Cr, Ti or polysilicon, but preferably not Ta.

Figure 4B:
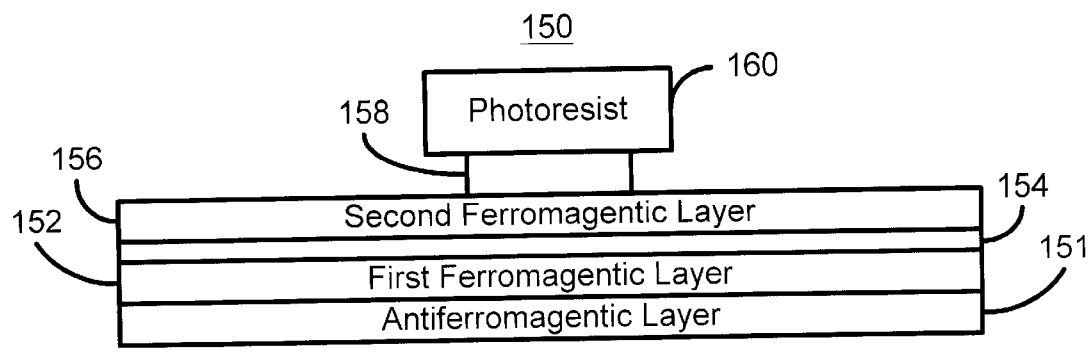
Figure 4C:
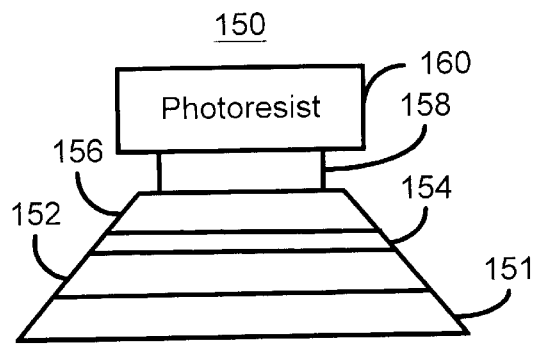

The first material 158 is then undercut using a plasma etch, via step 108. The plasma etch performed in step 108 does not significantly etch the layer below the first material 158. Thus, the top ferromagnetic layer 156 of the TMR sensor 150 is not adversely affected by the plasma etch which undercuts the first material. FIG. 4B depicts the TMR element 150 after step 108 has been performed. The first material 158 has been undercut. Consequently, the first material 158 and the resist 160 form a bi-layer structure that can be used to define the TMR element 150. Thus, the TMR element 150 is defined, via step 110. Step 110 preferably includes either ion milling or reactive ion etching the layers 152, 154 and 156 using the resist 160 and first material 158 as a mask. FIG. 4C depicts the TMR element 150 after step 110 has been performed.

Figure 4D:
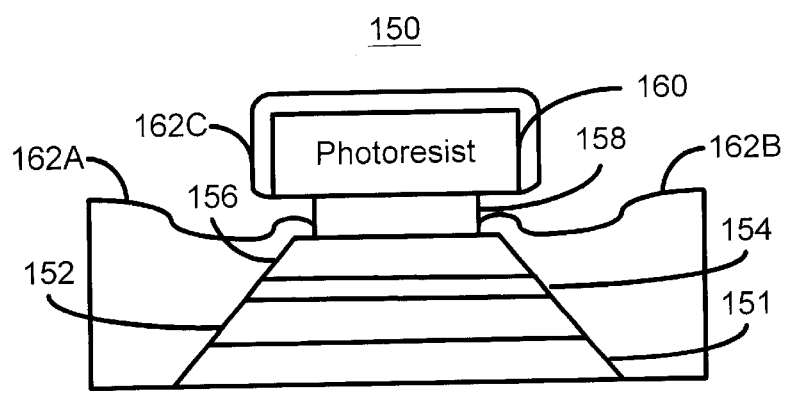
Figure 4E:
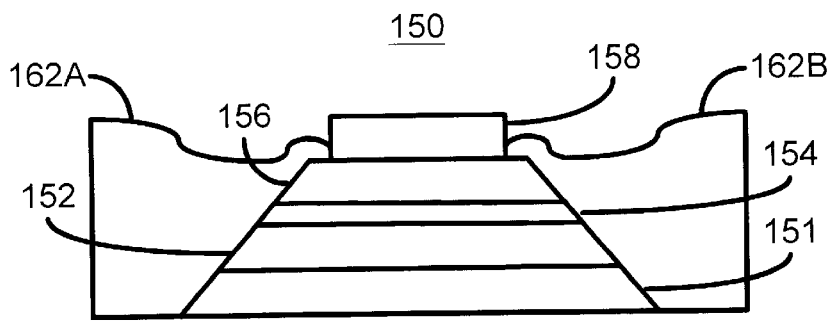

An insulating layer is deposited to partially encapsulate the TMR element 150, via step 112. FIG. 4D depicts the TMR element 150 after deposition of the insulating layer including portions 162A, 162B and 162C. Insulating layer 162A and 162B cover the edge of the TMR element 150. Insulating layer 162C covers the photoresist 160. The photoresist 160, and thus the insulating layer 162C, is then removed, via step 114. FIG. 4E depicts the TMR element 150 after removal of the photoresist 160. The first material 158 that is part of the bi-layer structure used to define the TMR element 150 remains after removal of the photoresist 160. The insulating layers 162A and 162B cover a portion of the TMR element 150 and a portion of the first material 158. In other words, because the first material 158 is provided prior to the insulating layers 162A and 162B, the first material 158 does not reside on the insulating layers 162A and 162B. The first material 158 remains on the TMR element 150. As a result, electrical contact can be made to the TMR element 150 through the first material 158. Furthermore, the TMR element 150 is encapsulated in the combination of the first material 158 and the insulating layers 162A and 162B.

Thus, the first material 158 is used both as part of a bi-layer structure in forming the TMR element 150 and in providing contact to the TMR element 150. Because the plasma etch is used to undercut the first material 158 the bi-layer structure formed by the first material 158 and the photoresist 160 can be formed even at smaller sizes of the TMR element 150. For example, the method 100 can be used to fabricate TMR elements 0.5 $\mu$m in size or smaller. Furthermore, in addition to being used for defining the TMR element 150, electrical contact can be made to the TMR element 150 through the first material 158. Because current runs perpendicular to the layers of the TMR element 150, the contribution to the resistance of the TMR element 150 by the first material 158 is relatively small. As a result, performance of the TMR element 150 is relatively insensitive to geometric variations in the first material 158. Because the first material 158 is used both in defining the TMR element 150 and in providing electrical contact to the TMR element 150, the contact to the TMR element 150 can be considered to be self-aligned.

Figure 5:
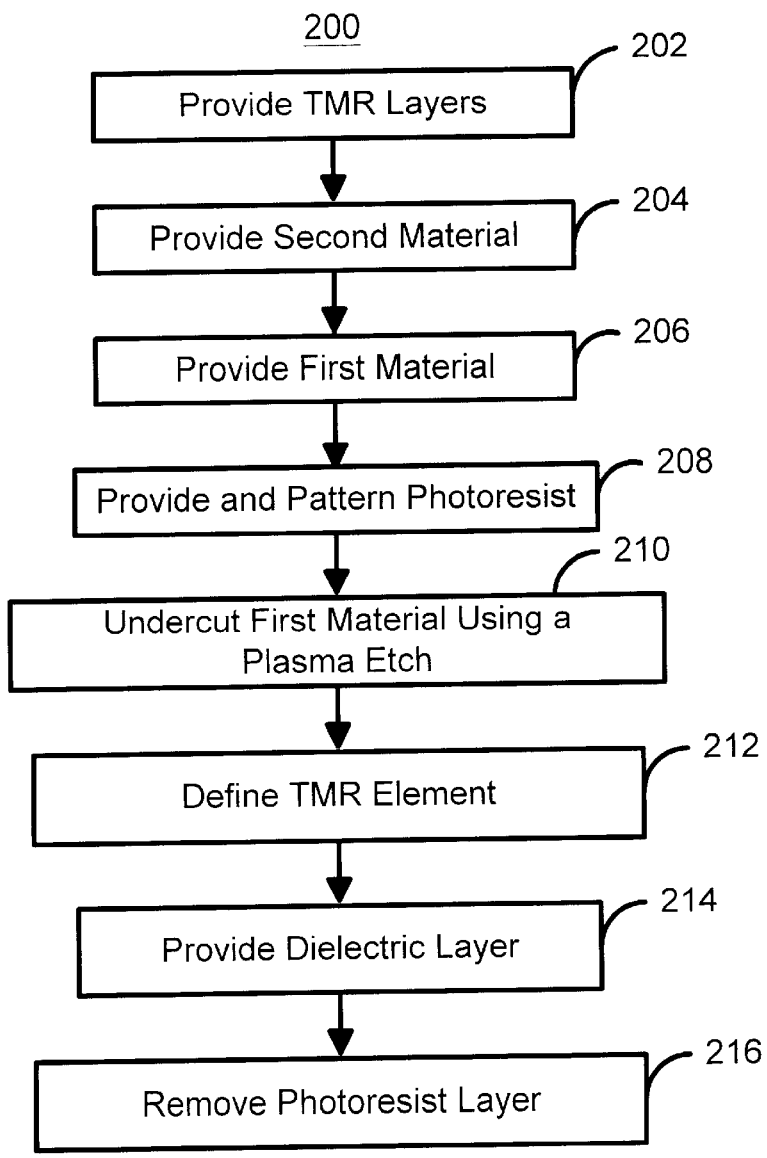
FIG. 5 is a flow chart depicting a second embodiment of a method in accordance with the present invention for providing a TMR sensor in accordance with the present invention.

FIG. 5 is a flow chart depicting a second embodiment of a method 200 in accordance with the present invention for providing a TMR sensor. FIGS. 6A–6E are diagrams of a second embodiment of a TMR element 250 in accordance with the present invention during formation. Referring to FIGS. 5 and 6A–6E, the layers for the TMR element are formed, via step 202. Step 202 includes forming two ferromagnetic layers separated by a nonmagnetic insulating layer. A second material is then deposited, via step 204. A first material is then deposited, via step 206. Electrical contact can be made to the TMR element 250 through the first material and the second material. The first material is also capable of being undercut by a plasma etch without exposing a portion of the tunneling magnetoresistive layer under a remaining portion of the first material. In a preferred embodiment, this is achieved by ensuring that the second material is resistant to an etch which can remove the first material. Thus, the first material will perform essentially the same functions as the first material 158 used in the TMR element 150. The second material is preferably Pd, Pt or Au. The first material is preferably Ti, Ta or Cr.

Figure 6A:
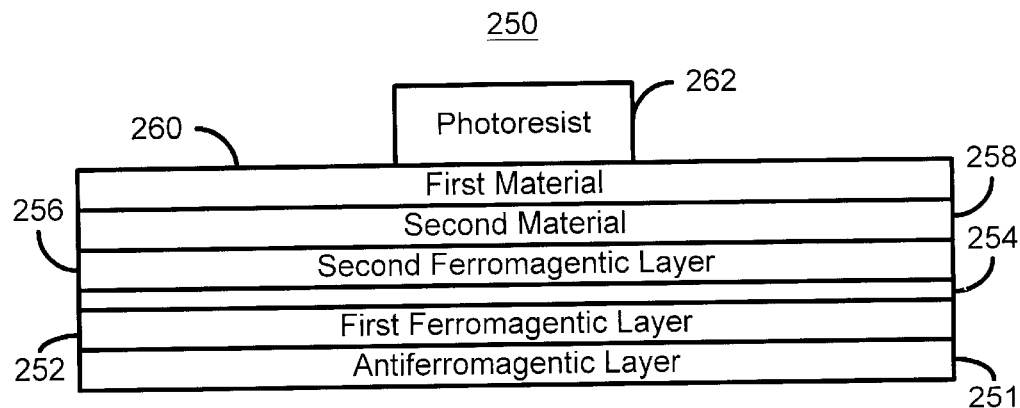
FIGS. 6A–6E are diagrams of a second embodiment of a TMR element in accordance with the present invention during formation.

A layer of photoresist is provided and patterned, via step 208. Preferably, the photoresist is patterned by photolithography. FIG. 6A depicts one embodiment of the TMR element 250 in accordance with the present invention after step 208 has been performed. The layers that form the TMR element 250 include ferromagnetic layers 252 and 256 separated by a thin insulating layer 254, as well as antiferromagnetic layer 251. Thus, the TMR element 250 shown is a bottom pinned TMR element. However, nothing prevents the use of a top pinned TMR element, which is also consistent with the present invention. The insulating layer 254 is thin enough to allow charge carriers to tunnel between the ferromagnetic layers 252 and 256. Also depicted are the second material 258 and the first material 260.

Figure 6B:
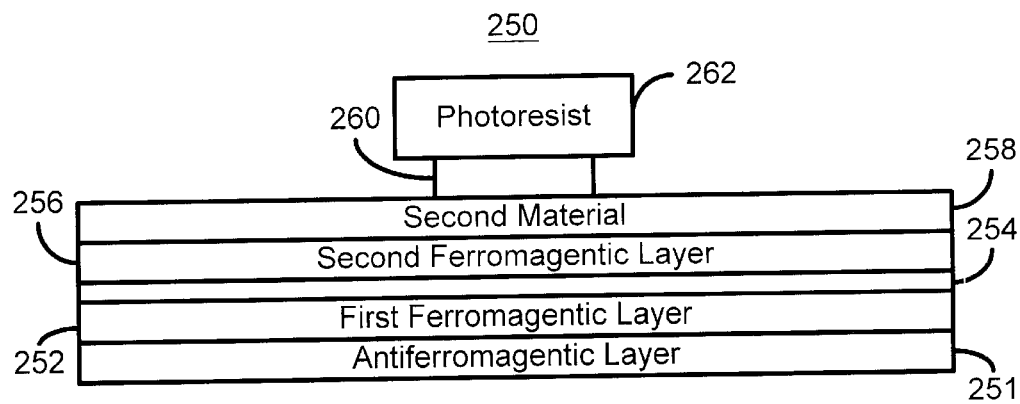
Figure 6C:
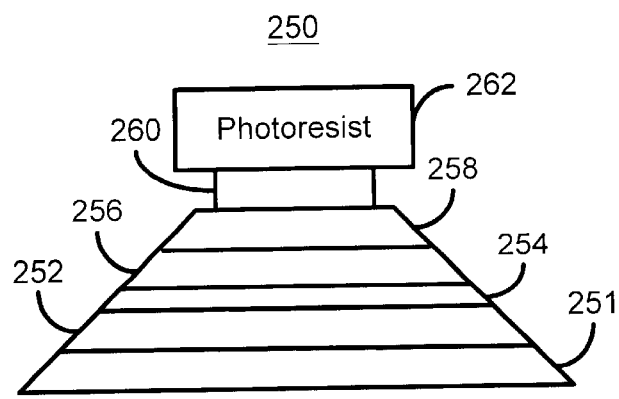

The first material 260 is then undercut using a plasma etch, via step 210. The plasma etch performed in step 210 does not significantly etch the second material 258. Thus, the top ferromagnetic layer 256 of the TMR sensor 250 is not adversely affected by the plasma etch which undercuts the first material 260. FIG. 6B depicts the TMR element 250 after step 210 has been performed. The first material 260 has been undercut. Consequently, the first material 260 and the resist 262 form a bi-layer structure that can be used to define the TMR element 250. Thus, the TMR element 250 is defined, via step 212. Step 212 preferably includes either ion milling or reactive ion etching the layers 252, 254, 256 and 258 using the resist 262 and first material 260 as a mask. FIG. 6C depicts the TMR element 250 after step 212 has been performed.

Figure 6D:
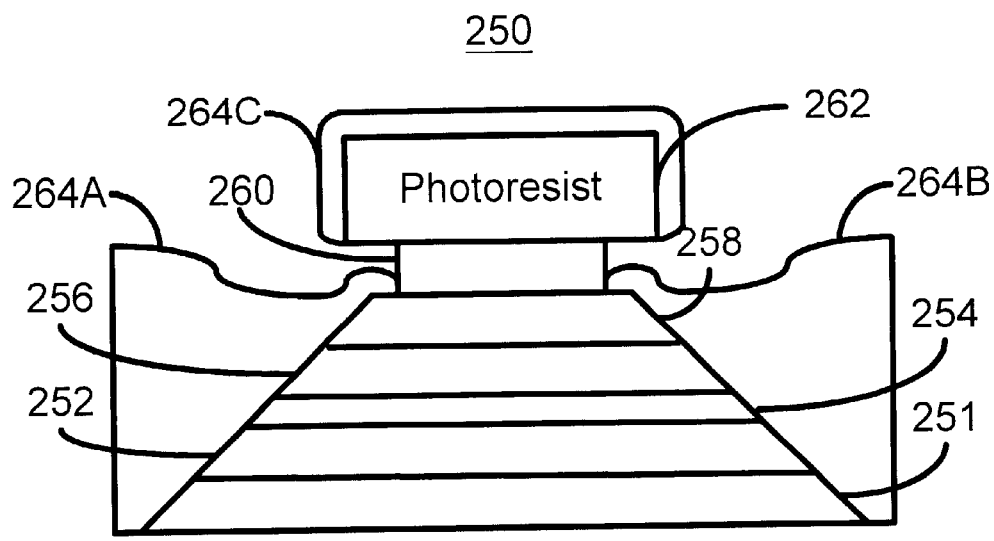
Figure 6E:
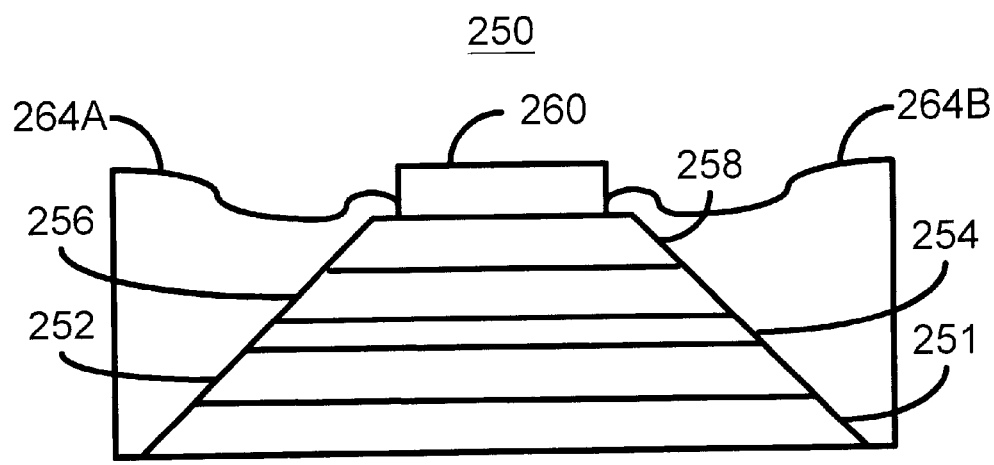

An insulating layer is deposited to partially encapsulate the TMR element 250, via step 214. FIG. 6D depicts the TMR element 250 after deposition of the insulating layer having portions 264A, 264B and 264C. Insulating layer 264A and 264B cover the edge of the TMR element 250. Insulating layer 264C covers the photoresist 262. The photoresist 262, and thus the insulating layer 264C, is then removed, via step 216. The first material 260 that is part of the bi-layer structure used to define the TMR element 250 remains after removal of the photoresist 262. FIG. 6E depicts the TMR element 250 after removal of the photoresist 262. The insulating layers 264A and 264B cover a portion of the TMR element 250 and a portion of the first material 260. In other words, because the first material 260 is provided prior to the insulating layers 264A and 264B, the first material 260 does not reside on the insulating layers 264A and 264B. The first material 260 remains on the TMR element 250. As a result, electrical contact can be made to the TMR element 250 through the second material 158 and the first material 260. Furthermore, the TMR element 250 is encapsulated in the combination of the second material 258 and the insulating layers 264A and 264B.

Thus, the first material 260 is used both as part of a bi-layer structure in forming the TMR element 250 and in providing contact to the TMR element 250. The plasma etch is used to undercut the first material 260. The bi-layer structure formed by the first material 260 and the photoresist 262 can be formed even at smaller sizes of the TMR element 250. For example, the method 200 can be used to fabricate TMR elements 0.5 $\mu$m in size or smaller. Furthermore, in addition to being used for defining the TMR element 250, electrical contact can be made to the TMR element 250 through the second material 258 and the first material 260. Because the first material 260 is used in defining the TMR element 250, the contact to the TMR element 250 can be considered to be self-aligned. Moreover, current runs perpendicular to the layers of the TMR element 250. The contribution to the resistance of the TMR element 250 by the first material 260 is thus relatively small. As a result, performance of the TMR element 250 is relatively insensitive to geometric variations in the first material 260.

A method and structure has been disclosed for providing a TMR sensor, as well as providing a contact to the TMR sensor. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:
1. A tunneling magnetoresistive element comprising:
a tunneling magnetoresistive layer including a first magnetic layer, a second magnetic layer and a first insulating layer disposed between the first magnetic layer and the second magnetic layer;
a first material for providing electrical contact to the tunneling magnetoresistive layer, the first material being disposed above the tunneling magnetoresistive layer, the first material being undercut with respect to a second insulation layer by an plasma etch without exposing a portion of the tunneling magnetoresistive layer under a remaining portion of the first material, the second insulation layer being a photoresist;

the second insulation layer covering a portion of the tunneling magnetoresistive layer and a portion of the first material.

2. The tunneling magnetoresistive element of claim 1 wherein the first material further includes Cr.

3. The tunneling magnetoresistive element of claim 1 further comprising:

a second material, the second material being disposed between the tunneling magnetoresistive layer and the first material, the second material allowing electrical contact to be made to the tunneling magnetoresistive layer through the first material and the second material, the second material being resistant to removal by the plasma etch.

4. The tunneling magnetoresistive sensor of claim 3 wherein the first material is disposed between the second material and the second insulating layer.

5. The tunneling magnetoresistive sensor of claim 3 wherein the first material includes Ti, Ta or Cr.

6. The tunneling magnetoresistive sensor of claim 3 wherein the second material includes Pd, Pt or Au.

* * * * *